United States Patent

Niwa et al.

[11] Patent Number: 6,048,666
[45] Date of Patent: Apr. 11, 2000

[54] RADIATION SENSITIVE RESIN COMPOSITION

[75] Inventors: Kazuaki Niwa; Masako Suzuki; Toshiyuki Ota; Hozumi Sato; Hideki Chiba, all of Tokyo, Japan

[73] Assignee: JSR Corporation, Tokyo, Japan

[21] Appl. No.: 09/089,501

[22] Filed: Jun. 3, 1998

[30] Foreign Application Priority Data

Jun. 4, 1997 [JP] Japan .................................. 9-146491

[51] Int. Cl.$^7$ ............................ G03F 7/038; G03F 7/004; G03F 7/16; G03F 7/40
[52] U.S. Cl. ........................ 430/280.1; 430/18; 430/313; 430/314; 430/315; 430/318; 430/935; 522/63; 522/110
[58] Field of Search ..................... 430/280.1, 18, 430/313, 314, 315, 318; 522/63, 110

[56] References Cited

U.S. PATENT DOCUMENTS

| | | | |
|---|---|---|---|
| 3,825,430 | 7/1974 | Kurka | 96/115 R |
| 5,073,477 | 12/1991 | Kusuda et al. | 430/287.1 |
| 5,262,280 | 11/1993 | Knudsen et al. | 430/280.1 |
| 5,372,913 | 12/1994 | Nanpei et al. | 430/281.1 |
| 5,688,598 | 11/1997 | Keck et al. | 428/458 |
| 5,830,621 | 11/1998 | Suzuki et al. | 430/287.1 |

OTHER PUBLICATIONS

Elf–altochem from http:///www.Elf–atochem.com/new elf/functional/polybd.html. 2 pages Jul. 13, 1999.

*Primary Examiner*—Cynthia Hamilton
*Attorney, Agent, or Firm*—Oblon, Spivak, McClelland, Maier & Neustadt, P.C.

[57] ABSTRACT

A radiation sensitive resin composition comprising an alkali-soluble resin such as a polyvinyl phenol or a phenol resin other than a polyvinyl phenol having a weight average molecular weight of 2,000 or higher, a cross-linking agent such as an amino resin having two or more active methylol groups in a molecule, a particulate rubbery material comprising a cross-linked polymer chemically modified with an epoxy compound, a liquid rubbery material having a number average molecular weight between 1,000 and 10,000 and a glass transition temperature of −20° C. or lower, and a radiation polymerization initiator. The composition is best suited for use as a material for preparing an insulating layer interposed between two layers of conductive wiring that are arranged in an overlaying stack.

18 Claims, No Drawings

RADIATION SENSITIVE RESIN COMPOSITION

DETAILED DESCRIPTION OF THE INVENTION

1. Field of the Invention

This invention relates to a radiation sensitive resin composition, and more specifically, to a radiation sensitive resin composition which is best suited for use as a material for preparing an insulating layer interposed between two layers of conductive wiring that are arranged in an overlaying stack.

2. Description of the Background Art

In recent years, in order to manufacture printed circuit boards having a higher circuit density, increasing importance is being placed on multi-layered circuit boards that are made up of a number of conductive wiring layers overlaid on top of one another with an interposed insulating layer. One of the known methods for manufacturing such multi-layered circuit boards involves stacking a multiple number of circuit boards comprising conductive wiring prepared on a substrate, with an interposing insulating layer of a sheet impregnated with a thermosetting resin (called a "prepreg") between juxtaposing layers; press- forming them to result in a laminated structure, the entire thickness of which is then pierced through by a process such as drilling to prepare a cavity called a through hole; and providing the inner wall of the through hole with a conductive plating to establish electrical continuity between the layers of conductive wiring. (This method may hereinafter be referred to as the "laminate-press method".) However, as the circuit patterns become more and more minute, the above laminate-press method has begun to exhibit a multitude of problems such as difficulty in aligning the required number of circuit boards, dislocation of wiring positions due to shrinkage of the circuit substrates, limitations in making the through hole diameters small enough to handle minute circuit patterns, or increasing complexity in the manufacturing process.

Meanwhile, in another method proposed, an insulating layer is prepared on top of a circuit board with conductive wiring thereon, then additional conductive circuitry is created on the insulating layer so that the circuit is connected to the first one, and the same process is repeated to manufacture a multi-layered circuit board as desired. (This method may hereinafter be referred to as the "stacking method".) To electrically connect two juxtaposing circuit layers in this stacking method, in addition to boring and plating through holes as in the laminate-press method, there is another technique in which a cavity called a via-hole is prepared by drilling so that it runs through a limited number of insulating layers and is then plated.

Further, as a means of providing the insulating layers with through holes or via-holes, there are known methods such as one utilizing an excimer laser, or preparing a required pattern using a processing resist and etching the insulating layer away with appropriate solvents. However, these methods are not very desirable from the productivity standpoint since they are either unable to make more than one hole at a time or require many process steps. The above mentioned methods also do not provide sufficient processing precision.

For these reasons, a process using a photosensitive resin composition as a material to form the insulating layer interposed between layers of conductive wiring and preparing piercing holes in such insulating layers by means of photolithography is proposed. Since this process enables a number of piercing holes to be prepared at one time, providing high productivity and also allows preparation of piercing holes with higher precision in comparison with conventional methods, it is advantageous in manufacturing multi-layered circuit boards with minute circuit patterns. These piercing holes provided on the insulating layers made of photosensitive resin composition and subsequently plated to attain electrical connections are called photo-via-holes, and a method of manufacturing a multi-layered circuit board with photo-via-holes by way of the stacking method has been proposed (Japanese Patent Application Laid-Open No. 148590/1992). In addition, an application example using an epoxy resin for the photosensitive resin composition to prepare such an insulating layer has been recited as well (Japanese Patent Application Laid-Open No. 273753/1993).

As described above, since the method of manufacturing a multi-layered circuit board based on the insulating layers made of photosensitive resin composition by way of the stacking method enables the creation of a multiple laminated structure without the need for a pressing process, as well as a high precision formation of photo-via-holes with sufficiently minute diameters by means of photolithography, the method provides for advantageous manufacturing of multi-layered circuit boards with minute circuit patterns.

Whereas for the photosensitive resin composition to be used in preparing the insulating layers in the process of manufacturing multi-layered circuit boards by the stacking method, the following performance is required:

(1) The resultant insulating layer should possess excellent resolution. This enables high precision formation of photo-via-holes with small diameters corresponding to minute circuit patterns.

(2) The resultant insulating layer should possess sufficient resistance ("anti-plating solution properties") to chemicals such as an electroless copper plating solution used in preparing conductive wiring.

(3) The resultant insulating layer should have a surface condition which allows formation of conductive wiring by means of electroless copper plating and with sufficient adhesion. It is noted here that, to improve the adhesion of the conductive wiring prepared by copper plating, it is effective to provide the subject insulating layer with a roughening treatment, since an insulating layer after such a treatment will provide greater adhesion for the conductive wiring through its anchoring effect.

(4) The resultant insulating layer should allow use of alkaline solution as the developer to prepare the photo-via-holes. Use of alkaline solution will help suppress adverse effects on human health as well as environment.

(5) The resultant insulating layer should possess sufficient dielectric strength to assure highly reliable performance and also high heat resistance. These properties will permit advantageous application of resultant products for electronic appliances, for which designs are becoming increasingly smaller and lighter.

The object of this invention is to provide a radiation sensitive resin composition which can be used to prepare an insulating layer that has high resolution enabling high precision formation of, for example, photo-via-holes with small diameters; which layer can be developed with an alkaline solution, and has a high resistance to plating solutions as well as high heat resistance, on top of a capability that allows preparation of conductive wiring with excellent adhesion.

Another object of the present invention is to provide an improved and efficient method for fabricating a multi-layered circuit board according to the stacking method, which comprises repetition of a step of preparing an insulating layer on top of a circuit board with conductive wiring thereon and a step of producing an additional conductive circuitry on the insulating layer so that the circuit is connected to the first circuit board.

SUMMARY OF THE INVENTION

The above object can be achieved in the present invention by a radiation sensitive resin composition comprising an alkali-soluble resin (hereinafter called component (A)), a cross-linking agent(hereinafter called component (B)), a particulate rubbery material (hereinafter called component (C)), a liquid rubbery material (hereinafter called component (D)), and a radiation polymerization initiator(hereinafter called component In preferred embodiments of the present invention, the component (A) is an alkali-soluble resin comprising either one or both of a polyvinyl phenol and a phenol resin (other than a polyvinyl phenol) having a weight average molecular weight of 2,000 or higher, the component (B) is an amino resin having two or more active methylol groups in the molecule, the component (C) is a particulate rubbery material comprising a cross-linked polymer chemically modified by an epoxy compound, and the component (D) is a liquid rubbery material having a number average molecular weight between 1,000 and 10,000 and a glass transition temperature of −20° C. or lower.

The above another object to provide an improved and efficient stacking method for fabricating a multi-layered circuit board can be achieved in the present invention by a method of using the above radiation sensitive resin composition for preparing the insulating layer.

Other and further objects, features and advantages of the present invention will appear more fully from the following description.

DETAILED DESCRIPTION OF THE INVENTION AND PREFERRED EMBODIMENTS

In the following sections, the words "light" and "photo" contained in any word and phrase are intended to mean radiation such as visible rays, ultraviolet rays, far ultraviolet rays, X-rays, or electron beams, barring obvious exceptions.

In the following sections, a more detailed description of the radiation sensitive resin composition of the present invention will be provided.

<Component (A)>

Component (A) is an alkali-soluble resin and preferably an alkali-soluble resin comprising either one or both of a polyvinyl phenol, and a phenol resin other than a polyvinyl phenol and having a weight average molecular weight of 2,000 or higher (hereinafter called the "specified phenol resin").

For the polyvinyl phenol to be utilized as the component (A), products that can be given are prepared by various methods such as by conventional polymerization of vinylphenol monomer, or by polymerizing with the phenolic hydroxyl group protected by a protecting group which is released after the polymerization process. In addition, various substituted polyvinylphenols, prepared from vinylphenol monomers into which various substitutional groups are introduced, can be used, examples of which include vinylcresol, 2,4-dimethyl vinylphenol, fluorinated vinylphenol, chlorinated vinylphenol, and brominated vinylphenol.

Although there are no specific restrictions for the molecular weight of the polyvinyl phenols, it is preferred that the polystyrene reduced weight average molecular weight measured by gel permeation be 2,000 or higher and, in particular, within a range of 2,000 to 20,000 from the standpoint of resolution, developing properties, and resistance to plating solutions of the resultant insulating layer.

For a specified phenol resin to be utilized as the component (A), a novolak resin can be mentioned. A novolak resin can be prepared by addition condensation of aromatic compounds containing a phenolic hydroxyl group (hereafter "phenols") and aldehydes, with the presence of an acid catalyst and preferably in a molar ratio of 0.7 to 1 mol aldehydes to 1 mol phenols. Specific examples of phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 3,6-xylenol, 2,3,5-trimethylphenol, 3,4,5-trimethylphenol, p-phenylphenol, resorcinol, hydroquinone, hydroquinone monomethyl ether, pyrogallol, phloroglucinol, hydroxydiphenyl, bisphenol-A, gallic acid, gallic acid esters, α-naphthol, and β-naphthol.

Specific examples of the aldehydes include formaldehyde, paraformaldehyde, furfural, benzaldehyde, nitrobenzaldehyde, and acetoaldehyde. For the acid catalyst, for example, hydrochloric acid, nitric acid, sulfuric acid, formic acid, oxalic acid, or acetic acid can be used. For the specified phenol resins to be utilized as the component (A), it is preferred that the weight-average molecular weight be 2,000 or higher and, in particular, within a range of 2,000 to 20,000 from the standpoint of resolution, developing property, and resistance to plating solutions of the resultant insulating layer.

While in the present invention it is possible to use either one or both of the polyvinyl phenols and the specified phenol resins given above, either singly or in combination of two or more, it is particularly preferable to use a polyvinyl phenol and a specified phenol resin in combination.

In the composition according to the present invention, the ratio of the component (A) is set at a level at which the resultant insulating layer should exhibit sufficient alkali solubility, which generally is between 30% to 75% by weight, but preferably between 40% to 70% by weight respectively of the total composition. If the ratio is too low the film obtained by the resultant composition may not exhibit sufficient solubility in an alkaline solution, while an excessively high ratio may potentially lead to insufficient toughness, heat resistance, and resistance to plating solutions of the resultant insulating layer as a result of the relative shortage of other components in the composition.

<component (B)>

The component (B) is a cross-linking agent and preferably an amino resin which has more than one active methylol group in a molecule so that it can function as a curing agent by reacting with the component (A), which is an alkali-soluble resin, to form a cross-linked structure.

For the amino resins to be used as the component (B), nitrogen-containing compounds having multiple active methylol groups in a molecule can be mentioned, including (poly)methylol melamine, (poly)methylol glycoluryl, (poly) methylol benzoguanamine, (poly)methylol urea; or their derived compounds made by substituting hydrogen atoms in the hydroxyl groups of relevant methylol groups with alkyl groups such as methyl or butyl groups; or a mixture of two or more such substitution derivatives. Further, component (B) can be a compound that contains oligomers from intramolecular condensation of the compounds mentioned above.

For the amino resins to be used as the component (B), examples of available products include the Cymel series products such as hexamethoxymethyl melamine ("Cymel 300"), or tetrabutoxymethyl glycoluryl ("Cymel 1700") made by Mitsui Cyanamide Co., Ltd., as well as the Mycoat series or the UFR series products, with hexamethoxymethyl melamine being particularly preferred. These amino resins mentioned above can be used either singly or in combinations of two or more products.

In the composition according to the present invention, the ratio of the component (B) needs to be set within a range in which the thin film resulted from the subject composition will be hardened sufficiently by the actions of the photo-polymerization initiator and the heat, which specifically is from 10 to 60 weight parts, and preferably from 15 to 50 weight parts, respectively in proportion to 100 weight parts of the component (A). If the ratio is too low the film obtained by the resultant insulating layer may not exhibit sufficient toughness, heat resistance, and resistance to plating solutions, while an excessively high ratio may potentially lead to insufficient developing properties for the thin film resulted from the subject composition.

<Component (C)>

The component (C) is a particulate rubbery material and preferably one comprising a cross-linked polymer that is chemically modified by an epoxy compound and is present in the composition according to the present invention in an evenly dispersed state to provide its function in the roughening treatment for the surface of the insulating layer.

The particulate rubbery material as the component (C) is prepared by chemically modifying a particulate rubbery material containing functional groups (such as a carboxyl group that will react with an epoxy group) with an appropriate epoxy compound, and having an average particle size between 0.01 to 20 µm in diameter and which preferably between 0.01 to 5 µm.

The particulate rubbery material for preparing the particulate rubbery material as the component (C) comprises cross-linked polymers containing carboxyl group, which are prepared for example by copolymerizing a monomer composition containing the monomers listed in the following (a), (b), and (c):

(a) A polyfunctional monomer possessing two or more polymerizable double bonds in a molecule.
(b) A monomer containing carboxyl group (hereinafter called a "carboxyl group-containing monomer"), copolymerizable with the polyfunctional monomer as described in (a).
(c) Copolymerizable monomers other than (b) above which are copolymerizable with the polyfunctional monomer as described in (a).

As the polyfunctional monomers (a) that possess two or more polymerizable double bonds in a molecule, for example, ethylene glycol di(meth)acrylate, trimethylolpropane di(meth)acrylate, trimethylolpropane tri(meth)acrylate, propylene glycol di(meth)acrylate, pentaerithritol tri(meth)acrylate, pentaerithritol tetra(meth)acrylate, 1,4-butanediol di(meth)acrylate, 1,6-hexanediol di(meth)acrylate, divinylbenzene, trivinylbenzene can be mentioned. The polyfunctional monomers mentioned above can be used either singly or in combination of two or more.

The polyfunctional monomer (a) is used in a ratio of 0.1 to 20 mol %, preferably between 0.5 to 10 mol %, in proportion to the total monomer composition for preparing the particulate rubbery material. If the ratio is less than 0.1 mol %, the surface roughening of the insulating layer cannot be fully achieved since the shape of the particulate rubbery material is not adequately maintained in the composition. On the other hand, if the ratio exceeds 20 mol %, the resultant particulate rubbery material will not completely dissolve during the roughening treatment and the surface roughening of the insulating layer cannot be sufficiently achieved as a result. In addition, it lowers the affinity of the resultant particulate rubbery material to other components of the composition thereby reducing the processability of the resultant composition, decreasing the strength of the insulating layer after the photo-curing treatment, and causing an adhesion deficiency in the plated layer to be formed later on the surface.

As specific examples of the carboxyl group-containing monomer (b), acrylic acid, methacrylic acid, maleic acid, fumaric acid, itaconic acid, tetraconic acid, half-esters between an unsaturated alcohol having addition-polymerizable groups and dicarboxylic acid such as succinic acid, fumaric acid can be mentioned.

The carboxyl group-containing monomer (b) mentioned above can be used as desired by selecting one or more of them depending on the specific application for the resultant composition.

The carboxyl group-containing monomer (b) mentioned above is used in a ratio between 0.1 to 30 mol %, preferably between 0.5 to 20 mol %, in proportion to the total monomer composition for preparing the particulate rubbery material. If the ratio is less than 0.1 mol %, the particulate rubbery material prepared by epoxy modification treatment will have insufficient quantity of the epoxy group on its surface and therefore insufficient affinity to the composition, making even dispersion difficult, which in turn results in failure to achieve the desired degree of surface roughening as well as in an insulating layer lacking toughness and resolution; while a ratio in excess of 30 mol % will yield too hard and brittle an insulating layer which is equally undesirable.

For the copolymerizable monomers (c) to be used with the polyfunctional monomer (a) and the carboxyl group- containing monomer (b) mentioned above, various radical polymerization monomers are available depending on application.

For such copolymerizable monomers, for example, butadiene, isoprene, dimethylbutadiene, and chloroprene can be mentioned as well as styrene, α-methylstyrene, vinyltoluene, acrylonitrile, vinyl chloride, vinylidene chloride, (meth)acrylamide, methyl(meth)acrylate, ethyl (meth)acrylate, n-propyl(meth)acrylate, and 2-ethylhexyl (meth)acrylate.

While the particulate rubbery material can be prepared directly as a particulate copolymer by an emulsion polymerization method or a suspension polymerization method using a radical polymerization initiator, the emulsion polymerization method is preferred because of the particle size and the size uniformity it offers.

For preparation with the emulsion polymerization method, the polyfunctional monomer (a), the carboxyl group-containing monomer (b), and the copolymerizable monomer (c) mentioned above can be polymerized in radical emulsion polymerization, and then processed by salting out, washing, and drying in accordance with commonly known procedures. In this case the polymerization chemicals such as monomers and the radical polymerization initiator may be added all at once at the beginning of the reaction, or added separately in the desired sequence. The polymerization reaction is performed in a reactor vessel in the absence of oxygen, at a temperature between 0 and 80° C. The operating conditions such as temperature or mixing being modifiable as desired during the reaction process. The polymerization process may be performed either continuously or in batches.

However, as the particulate rubbery material for making up a composition to form a laminated insulating layer intended for electronic components, it is preferred to use a particulate rubbery material of a low ion content prepared by a method, for example, outlined in Japanese Patent Application Laid-Open No. 206656/1990, the product of which can provide an insulating layer having excellent dielectric strength.

Substances suitable for the radical polymerization initiator to be used in the emulsion polymerization described above include organic peroxides such as benzoil peroxide, paramenthanehydro peroxide, lauroyl peroxide; diazo compounds as represented by azobis isobutylonitrile; inorganic compounds as represented by potassium persulfate; and redox system catalysts as represented by combinations of organic compounds-iron sulfate.

The particulate rubbery material prepared in procedures described above possesses on its surface carboxyl groups that will be epoxidated by an epoxy compound to yield a particulate rubbery material treated with an epoxy modification to be used as the component (C) of the composition according to the present invention.

For the epoxy modification, the carboxyl groups present on the grain surface of the particulate rubbery material can be converted into an epoxy group, for example, by heating and letting a particulate rubbery material which possess carboxyl group on the grain surface react with an epoxy compound which has two or more epoxy groups in a molecule, for example an epoxy resin. More specifically, the above can be achieved, for example, by letting a particulate rubbery material containing carboxyl groups and an epoxy resin react in a process solvent kept at a temperature between 40 and 100° C. and, for example, using a catalyst such as tetrabutyl ammonium bromide. There is no particular restriction for the process solvent provided that it is not concerned with the subject reaction and that it is capable of maintaining the reaction system uniform. The epoxy compound being used does not necessarily have to be in a liquid state.

The objective of the treatment of the particulate rubbery material with an epoxy compound can be achieved by mixing a particulate rubbery material with an epoxy compound and having them inter-react under heat. The proportions of the particulate rubbery material and the epoxy compound in the reaction mixture are preferably 10 to 30% by weight and 90 to 70% by weight, respectively. The molar ratio of the epoxy group held by the epoxy compound to the carboxyl group existent on the surface of the particulate rubbery material (i.e. the epoxy group/carboxyl group ratio) is usually set at 70 to 270. If the proportion of the particulate rubbery material in the reaction mixture exceeds 30% by weight, it lowers the degree of the epoxy modifications reduced, preventing uniform dispersion of the particulate rubbery material in the composition as a result. Epoxy resins are preferred as the epoxy compound to be used in the process. There are no particular restrictions on the epoxy resins and their various types such as a bisphenol type epoxy resin, (cresol) novolak type epoxy resin, or alicyclic type epoxy resin can be used as well as various types of modified epoxy resins such as a brominated epoxy resin, or urethane-modified epoxy resin.

The proportion of the epoxy compound used in the process described herein to the total composition is preferably 15% by weight or less. If this proportion exceeds 15% by weight, the resultant insulating layer will have inferior alkaline-developing properties which makes it difficult to obtain a good developing profile.

Furthermore, it is not necessary to modify all the carboxyl groups existent on the surface of the particulate rubbery material. Part can remain unmodified to possibly improve the developing property.

The component (C) which comprises the particulate rubbery material as described in the above is present in the composition according to the present invention in an evenly dispersed state and, in the process of providing the surface of the resultant insulating layer with a roughening treatment, selectively reacted on and dissolved by a strongly oxidizing surface roughening agent to achieve the function of roughening the surface of the insulating layer.

In other words, since the particulate rubbery material in question is treated with an epoxy modification, it possesses excellent affinity to other ingredients, which enables even dispersion in the composition according to the present invention.

Subsequently in the surface roughening treatment, a surface roughening agent with strong oxidizing properties comes into contact with the particulate rubbery material existent on the surface of the insulating layer, thereby splitting the double bonds in the copolymer which makes up the particulate rubbery material causing the copolymer to dissolve in the surface roughening agent. As a result, the particulate rubbery material in question is removed from the insulating layer forming a minute roughness on the surface of the insulating layer to achieve the purpose.

By comparison, the uniform dispersion of the particulate rubbery material cannot be obtained if the particulate rubbery material used is not treated with the epoxy modification. As a consequence, the condition of the resultant surface roughness becomes uneven and irregular.

Further, the uniform dispersion of the particulate rubbery material is also unavailable in the case where the epoxy compound, such as epoxy resin, used in the epoxy modification of the particulate rubbery material is used as a single ingredient.

Additionally, since the particulate rubbery material described above exists inside the insulating layer obtained from the composition according to the present invention in an evenly dispersed state, it helps alleviate stresses such as contraction stress caused in the insulating layer by exposure to light or by heat treatment, or thermal stress due to the difference in the thermal expansion coefficient of the insulating layer and the substrate, resulting in higher dimensional precision for the multi-layered circuit board as well as improved reliability for the insulating layer. Furthermore, use of the composition according to the present invention containing a particulate rubbery material enables improvement in the toughness of the resultant insulating layer to prevent cracks.

In the composition according to the present invention, the ratio of the component (C) must be set within a range in which the desired micro-roughness can be fully developed in the surface roughening treatment, which specifically is from 5 to 100 weight parts, preferably from 10 to 60 weight parts, and particularly preferably, from 12 to 23 weight parts in proportion to 100 weight parts of the component (A). If the ratio is too low, the desired effects of the surface roughening treatment cannot be achieved and the resultant insulating layer may not exhibit sufficient toughness, heat resistance, and resistance to plating solutions. An excessively high ratio may potentially lead to an insufficient developing properties for the thin film resulting from the subject composition.

<Component (D)>

The component (D) is a liquid rubbery material, and preferably a liquid rubbery material having a polystyrene reduced number average molecular weight measured by gel permeation between 1,000 and 10,000, and also a glass transition temperature ("Tg") of −20° C. or lower. Inclusion of the component (D) allows the composition according to the present invention to provide excellent adhesion between the insulating layer and the conductive wiring formed in a plating process, in particular, under a high temperature.

However, if a composition prepared with a liquid rubbery material of which the number average molecular weight is below 1,000, the resultant insulating layer does not have adequate resistance to plating solutions. An insulating layer prepared with a liquid rubbery material of a number average molecular weight exceeding 10,000 does not possess sufficient resolution.

Further, if the glass transition temperature, Tg, of the liquid rubbery material used is higher than −20° C., the resultant insulating layer will exhibit inferior adhesion to the conductive wiring, particularly under high temperature—high humidity conditions.

The liquid rubbery material to be used as the component (D) needs to possess high compatibility or affinity with the Components A, B, C, andE. In the case where the compatibility or affinity is insufficient, the resultant composition will exhibit a high stickiness that will cause handling difficulties.

While various synthetic rubbers in common knowledge can be mentioned as the liquid rubbery material for the intended use, acrylic rubber (ACM), acrylonitrile- butadiene rubber (NBR), and acrylonitrile-acrylate- butadiene rubber (NBA) are preferred because of the affinity to the component (A) and others. In addition, their varieties containing one or more functional groups selected from epoxy, hydroxyl, carboxyl, or amino groups can also be used as required. In practice, however, types containing epoxy or carboxyl groups, particularly a liquid rubbery material with a carboxyl group, are preferred. Specific examples of the component (D) include butadiene-acrylonitrile-methacrylic acid copolymer, butadiene-acrylonitrile-hydroxyethyl (meth) acrylic acid copolymer, butadiene-acrylonitrile-hydroxyethyl methacrylate-methacrylic acid copolymer, isoprene-acrylonitrile-hydroxyethyl (meth)acrylic acid copolymer, isoprene-acrylonitrile-methacrylic acid copolymer, and the like.

The liquid rubbery material as the component (D) can be prepared by any means, and the manufacturing process may be any of a variety such as emulsion polymerization, solution polymerization, bulk polymerization, suspension polymerization. The polymerization reaction can be carried out with any of a batch system, semi-continuous system, or continuous system. It is preferred that the liquid rubbery material be low in ion content, thus providing the resultant insulating layer with sufficient dielectric strength. The polymerization process for a monomer composition to obtain a liquid rubbery material including diene type monomers can easily be carried out by an emulsion polymerization method and, in particular, liquid rubbery material preparations with a low ion content can be obtained by a method outlined in Japanese Patent Application Laid-Open No. 74908/1987.

In the composition according to the present invention, the ratio of the component (D) must be set within a range in which the metal layer formed by means of a plating process has sufficient adhesion to the insulating layer prepared with the subject composition, which specifically is from 3 to 50 weight parts, and preferably from 7 to 40 weight parts in proportion to 100 weight parts of the component (A). If the ratio is too low, the resultant insulating layer will not impart adequate adhesion to the metal layer formed in a plating process, while an excessively high ratio may potentially cause a thin film prepared from the resultant composition to be insufficiently cured.

<Component (E)>

The component (E) is a radiation polymerization initiator (photochemical polymerization initiator).

As a photochemical polymerization initiator to be used for the component (E) in the present invention, a cationic polymerization initiator generally known as a photoacid generator is preferable, and a photoacid generator selected from the group consisting of onium salt photoacid generators, triazine acid acid generators, and sulfonic ester acid generators is particularly preferable. Specific examples include diazonium salt such as "Adeka Ultraset PP-33" (manufactured by Asahi Denka Kogyo Co., Ltd.), sulfonium salt such as "OPTOMER SP-150", "OPTOMER SP-170", and "OPTOMER SP-171" (manufactured by Asahi Denka Kogyo Co., Ltd.), metallocene compound such as "IRAGA-CURE 261" (manufactured by Ciba-Geigy), and a triazine compound such as "Triazine B", "Triazine PMS", "Triazine PP" (manufactured by Nihon Siber Hegner K. K.), and the like.

The dosage of the photochemical polymerization initiator to be used in the composition according to the present invention is preferably between 0.1 and 5% by weight, and more desirably, between 0.2 and 1.5% by weight, of the total weight of the Components A, B, C, and D. If the dosage is too low, the resultant insulating layer will have a substantially low sensitivity due to the effects from the surrounding environment such as oxygen. Too high a dosage will cause inferior compatibility with other components and reduce the storage stability of the composition.

The individual compounding ratios for each of the Components A, B, C, D, and E in the composition according to the present invention are generally 30 to 75% (preferably 40 to 70%) by weight for the component (A), 5 to 30% (preferably 10 to 25%) by weight for the component (B), 5 to 25% (preferably 10 to 20%) by weight for the component (C), 1 to 25% (preferably 3 to 20%) by weight for the component (D), and 0.1 to 5% (preferably 0.2 to 1.5%) by weight for the component (E) in the ratio to the total composition. However, these ratios vary depending on the actual requirement for the resolution properties, chemical resistance, or the adhesion properties of the plated layer, particularly if the composition is used as a laminated insulating layer for electronic components.

The composition according to the present invention may contain an adhesion aiding agent to improve the adhesion of the composition to the substrate to which it is applied. For the adhesion aiding agent, a functional silane coupling agent is effective. The functional silane coupling agent above refers to those containing reactive substitution groups such as a carboxyl group, methacryloyl group, isocyanate group, or epoxy group, for which specific examples include trimethoxysilyl benzoic acid, γ-methacryloxypropyltrimethoxysilane, vinyltriacetoxy silane, vinyltrimethoxysilane, γ-isocyanatopropyltriethoxysilane, γ-glycidoxypropyltrimethoxysilane, and β-(3,4-epoxycyclohexyl) ethyltrimethoxysilane. The preferred dosage is 2 parts or less for 100 parts by weight of the composition.

The composition according to the present invention may contain additives such as fillers, coloring materials, viscosity adjusting agents, leveling agents, anti-foaming agents, as necessary. For fillers, silica, alumina, talc, calcium carbonate, bentonite, zirconium silicate, glass powders or others can be mentioned, among which silica, talc, calcium carbonate or others are preferred. As coloring materials, examples that can be mentioned include extender pigments such as alumina white, clay, barium carbonate, or barium sulfate; inorganic pigments such as zinc white, white lead, chromium yellow, red lead, ultramarine blue, Prussian Blue, titanium dioxide, zinc chromate, iron oxide red, or carbon black; organic pigments such as Brilliant Carmine 6B, Permanent Red 6B, Permanent Red R, benzidine yellow, Phthalocyanine Blue, or Phthalocyanine Green; basic dyes such as magenta or Rhodamine; direct dyes such as Direct Scarlet or Direct Orange; and acid dyes such as Rocerine or Metanil Yellow. As viscosity adjusting agents, bentonite, silica gel, aluminum powders, or others can be mentioned as examples. For leveling agents, various silicone type compounds, polyalkylene oxide type compounds, or others can be mentioned as examples. As anti-foaming agents, silicone type compounds with a low surface tension or fluorine compounds, or others can be mentioned as examples.

The dosage for these additives is set within a range that will not harm essential characteristics of the composition, and preferably at 50% by weight or less of the total composition.

To compound the composition according to the present invention, it is sufficient to mix the components and stir with ordinary methods if no filler or coloring material is added, or disperse and mix using dispersing equipment such as a dissolver, homogenizer, or triple roll mill if filler or coloring material is added. If necessary, filtration can also be provided using a mesh or membrane filter or the like.

With the aim of adjusting viscosity, the composition according to the present invention may contain high boiling point solvents including N-methylformaldehyde, N,N-dimethylformaldehyde, N-methylformanilide, N-methylacetoamide, N,N-dimethylacetoamide, N-methylpyrolidone, dimethylsulfoxide, benzylethyl ether, dihexyl ether, acetonylacetone, isophorone, caproic acid, caprylic acid, 1-octanol, 1-nonanol, benzyl alcohol, benzyl acetate, ethyl benzoate, ethyl lactate, diethyl oxalate, diethyl maleate, γ-butylolactone, cyclohexanone, ethylene carbonate, propylene carbonate, phenyl cellosolve acetate, methoxymethylpropionate, ethoxyethylpropionate, diethyleneglycol dimethyl ether, diethyleneglycol methylethyl ether, triethyleneglycol dimethyl ether, triethyleneglycol methylethyl ether, among which methoxymethylpropionate, ethoxyethylpropionate, and the like are preferred.

The amount of these solvents may be adjusted according to the application of the composition in question or the method of coating and is not restricted in any particular manner provided the composition is maintained in a uniform state, but usually set between 5 to 60% by weight, or preferably between 10 to 40% by weight in the resultant composition.

Concerning the coating method for applying the composition according to the present invention to a substrate, there are no specific restrictions and any known method for applying a photosensitive material can be utilized. Specifically, techniques such as screen printing, roll coating, bar coating, dip coating, curtain flow coating, spin coating, or slit die coating can be mentioned. Additionally, it is also possible to fabricate the composition in a film like form and cause it adhere firmly to a substrate using a laminating device.

Manufacturing of a multi-layered circuit board using the composition according to the present invention involves a formation of a thin film comprising the said composition on an appropriate surface of a circuit board, on which a pattern of conductive wiring has been prepared, then, for example, creating piercing holes connecting to the said conductive wiring by providing the thin film with exposure and development processes, thereby leaving an insulating layer with the said portions of the said conductive wiring exposed, and generating a new pattern of conductive wiring on the surface of the said insulating layer so that it connects to the previous conductive wiring mentioned above; and repeating the whole series of process steps as above one or more times. In other words, the process includes forming an insulating layer made of the composition according to the present invention on a circuit board on which surface an "n"th conductive wire has been formed, and forming an "n+1"th conductive wire that connects to the "n"th conductive wire on the surface of this insulating layer by a process such as plating, where "n" is an integer equal to or larger than 1.

Using the composition according to the present invention in the above described manner enables efficient manufacturing of a highly reliable, heat resistant multi-layered circuit board with high density, high precision circuitry.

In the following sections, specific explanation is provided concerning the manufacturing of a multi-layered circuit board using the composition according to the present invention, in the order of the process steps involved:

(1) Thin film forming process:

In the thin film forming process, for example, the surface of a circuit board consisting of a layer of conductive wiring created on top of a substrate is coated with the composition according to the present invention so that the said conductive wiring is covered with this composition, which is then dried, heated, and stripped of the solvent contained in the composition, to deposit a thin film.

In the above mentioned process, there are no particular restrictions on the material for the substrate on which conductive wiring is formed. Examples may include glass-epoxy resin, paper-phenol resin, ceramics, glass, or silicon wafers. For coating methods, for example, spin coating, roll coating, curtain flow coating, screen printing, or an applicator method can be adopted.

Further, it is also possible to make a thin film by depositing and drying the composition according to the present invention on a base film to prepare a so-called dry film, and by causing it to adhere to a substrate using a laminating device or the like. For the base film in the above, particularly for one with transparency, polyester films such as polyethylene terephthalate or polybutylene terephthalate, or polyolefin films such as drawn polypropylene or polystylene may be used. It is noted here that when the base film used has transparency, a photo-curing process becomes available in which the light is directed through the said base film.

The conditions for drying after coating usually are 5 to 30 minutes under a temperature between 70 and 130° C., although this may vary according to component types and the dosage making up the composition according to the present invention, and to the film thickness. If the drying is insufficient, the residual solvent will cause stickiness on the film surface, and the adhesion of the insulating layer to the substrate becomes weaker. On the other hand, if the drying process is excessive, this gives rise to reduced resolution due to "heat blushing". The thin film is dried using ordinary equipment such as an oven or a hot plate.

The thickness of the thin film formed in the above process after the drying step, for example, is in the range between 5 and 100 $\mu$m, preferably between 10 and 70 $\mu$m. If the film thickness is insufficient, the resultant insulating layer will have inadequate insulation, while an excessive film thickness will bring about reduced resolution.

(2) Exposure process:

In the exposure process, ultraviolet or visible rays of a wavelength ranging from 200 to 500 nm are directed through a mask of a desired pattern on the thin film formed on a circuit board in the thin film forming process to provide a photo-curing effect to the illuminated area (exposed area) of the thin film.

For the exposure system, a fusion, contact aligner, stepper, or mirror projector or the like can be used. For the light source used in the exposing process, for example, a low pressure mercury lamp, high pressure mercury lamp, ultra-high pressure mercury lamp, metal halide lamp, argon gas laser, X-ray generator, and electron beam generator can be mentioned. The amount of exposure for a thin film is, for example, 100 to 2,000 mJ/cm$^2$ when a high pressure mercury lamp is used, although this may vary according to component types and dosage in the composition making up the thin film and to the film thickness.

(3) Heating process for reaction acceleration:

In the heating step for reaction acceleration, the thin film after the exposure process is usually heated at a temperature between 70 and 130° C. for approximately 1 to 20 minutes, thereby accelerating the hardening of the thin film by thermal reaction in addition to the photo-curing provided in the exposure process. Excessive heating, however, will lead to reduced resolution due to "heat blushing". The heating is performed with ordinary equipment such as an oven or a hot plate.

(4) Developing process:

In the developing process, the composition in the area left unexposed to light is removed by dissolving it using a developer chemical comprising aqueous alkali, leaving only the area of the exposed composition to produce the desired pattern.

For the developing solution, for example, an aqueous solution of alkaline compound such as sodium hydroxide, potassium hydroxide, sodium carbonate, sodium silicate, sodium metasilicate, ammonia, ethyl amine, n-propyl amine, diethyl amine, di-n-propyl amine, triethyl amine, methyldiethyl amine, dimethylethyl alcohol amine, triethyl alcohol amine, tetramethyl ammonium hydroxide, tetraethyl ammonium hydroxide, pyrrole, piperidine, 1,8-diazabicyclo [5.4.0]-7-undecene, or 1,5-diazabicyclo [4.3.0]-5-nonane can be used. Additionally, aqueous solutions prepared by adding an appropriate amount of surfactant or water-soluble organic solvent such as methyl alcohol or ethyl alcohol to any of the above alkaline solution, or various types of organic solvents that can dissolve the composition according to the present invention can be used as the developer. The preferred developing solutions include aqueous solutions of sodium hydroxide, potassium hydroxide, sodium carbonate, and tetramethyl ammonium hydroxide at a concentration between 0.1 and 6% by weight, and particularly preferably, between 0.5 and 3% by weight.

For the developing method, techniques such as puddle development, dipping development, spray development, or shower development can be mentioned. After completing the development, the material is rinsed, for example, with flowing water, followed by drying with equipment such as an air gun or an oven.

The developing process as described herein enables part of the thin film to be removed to produce, for example, piercing holes that expose a part of the conductive wiring on top of the substrate so that an insulating layer having photo-via-holes is provided.

(5) Heat curing/supplementary exposure process:

Since the composition according to the present invention possesses both photo-curing and heat curing characteristics, the heat curing and/or supplementary exposure treatment provided in this step allows further hardening of the insulating layer having the photo-via-holes. Accordingly, the heat curing/supplementary exposure process is not required if the insulating layer has already been sufficiently hardened. The heat curing process is performed with equipment such as a hot plate, an oven, or an infra-red oven, under temperature conditions that will not cause thermal degradation of the insulating layer, preferably between 120 and 180° C., and for an appropriate duration chosen within approximately 30 minutes to 5 hours. The supplementary exposure process can be given using a light source and equipment similar to that used in the exposure process for an exposure amount, for example, between 100 and 4,000 mJ/cm$^2$.

(6) Leveling process:

The leveling process is an optional process to provide polishing to improve flatness for an insulating layer formed, for example, on a substrate which is not flat, so that circuit forming precision is improved when conductive wiring is provided on such an insulating layer. Polishing means such as a buff roll, a nylon brush, or a belt sander can be used for the leveling process.

(7) Through hole forming process:

Through hole forming is a mechanical drilling process using tools such as a numerically controlled drilling machine, to be performed when a through hole is required for insertion of a component or connection with another circuit board, or, in other words, to achieve an inter-layer connection. Since the manufacturing method using the composition according to the present invention enables inter-layer connections by way of photo-via-holes, this process also is an optional one.

(8) Surface roughening process:

In the surface roughening process, the surface of the above mentioned insulating layer is processed with a surface roughening agent to improve the adhesion of conductive wiring formed on it.

For the surface roughening agent, alkaline chemicals such as aqueous potassium permanganate, aqueous solution of potassium permanganate and sodium hydroxide, or those having a strong oxidizing effect, such as a mixed acid of chromic acid anhydride and sulfuric acid can be used. Of the items mentioned, the aqueous solution of potassium permanganate and sodium hydroxide is particularly preferred. The actual surface roughening treatment can be provided by immersing the insulating layer in the surface roughening agent that is heated to a temperature between 50 and 80° C., and for a duration of 5 to 30 minutes. In addition, after the surface roughening treatment, a rinsing process with flowing water is required, preceded if necessary, by a neutralization process using an aqueous solution of weak acid such as oxalic acid.

The surface roughening treatment as described herein will give the surface of the insulating layer as well as the side walls of photo-via-holes or through holes a coarseness having a concave/convex profile of 0.01 to 10 μm. Through the anchoring effect this will provide greater adhesion for the copper plated layer composing the conductive wiring.

(9) Catalyst treatment process:

The catalyst treatment process provides the surfaces of the insulating layer and the inner walls of the piercing holes with a plating catalyst that will provide for deposition kernels when electroless copper plating is performed in the next process step. For the plating catalyst, colloidal metal such as palladium can be used. Catalyst bearing is achieved by immersing the insulating layer in various types of commonly known treating liquids made up of such colloidal metals dispersed in various media. Additionally, the composition according to the present invention can be compounded to contain the plating catalyst, in which case the process described herein may be omitted.

(10) Formation of new conductive wiring:

This is a process to form a new layer of conductive wiring (second conductive wiring) on an insulating layer, for example, by electroless copper plating, while establishing an electrical connection with the conductive wiring (first conductive wiring) already formed on the substrate through photo-via-holes and through holes. For the formation of a new layer of conductive wiring, for example, the following methods ① through ② can be given:

Method ①

In this method, a copper plated layer is first formed by an electroless copper plating process so that it fully covers the insulating layer bearing the plating catalyst. If necessary, a metallic copper layer of a desired thickness is built by electrolytic copper plating using the above plated surface as the electrode. A resist pattern is then developed on the metallic copper layer, which is followed by an etching process to produce the circuit pattern. In addition to the area for creating the second conductive wiring, the above resist pattern is also developed on the locations of the area for the photo-via-holes for inter- layer connection, i.e. the conductive lands, to connect the second conductive wiring to the first. In consideration of a possible positioning error, such conductive lands preferably should have a larger width or diameter than the photo-via-holes. The resist pattern is created usually by photolithography using a photo resist. The etching on the metallic copper is provided with etching liquids such as aqueous solutions of ammonium persulfate or ammine complex salts. The resist pattern is removed or peeled off by a prescribed procedure. For the photo resist, materials that possess required resolution and resistance to the etching liquid and that can be removed later are used. The second conductive wiring on an insulating layer is thus developed with an electrical connection to the first conductive wiring formed on the substrate.

Method ②

In this method, after developing a resist pattern on the insulating layer bearing the plating catalyst in the area that excludes the area for the new conductive wiring, an electroless copper plating process and, if necessary, an electrolytic copper plating process are performed to form the new conductive wiring on the insulating layer, as well as a copper plated layer on the inner walls of the photo-via-holes. The resist pattern is then removed. In this method, too, the conductive wiring preferably should have a larger diameter than the photo-via-holes.

Method ③

In this method, a coating of photosensitive resin composition without containing plating catalyst is first formed to fully cover the insulating layer bearing the plating catalyst. The coating is then exposed through a pattern mask and developed to produce photo-via-holes on the coating, while simultaneously removing the area for the second conductive wiring that has an electrical connection to the holes. Only the electroless copper plating is then provided. In this method, too, the width of the conductive wiring preferably should have a larger diameter than the photo-via-holes. Also, the thickness of the coating is preferably the same as for the copper plated layer or slightly larger.

With this method, since the second conductive wiring is produced on the area where the coating is removed, while the rest of the coating remains on the insulating layer and usually has a thickness similar to the copper layer, the resultant outer surface of the circuit board will have excellent flatness.

For the photosensitive resin composition to form the above coating, the composition according to the present invention can be used.

By repeating the above steps (1) through (10), further multi-layering can be achieved. In doing so, methods ① through ③ described above can be adopted in combination as the process of forming the new conductive wiring.

Additionally, post baking after developing the conductive wiring on the topmost insulating layer of a multi-layered circuit board is preferred, with the aim of improving the adhesion between the insulating layer and the conductive wiring. Since insulating layers other than the topmost layer, as well as their related conductive wiring, will be heated in the subsequent insulating layer building processes, post baking as a single process step is not required.

EXAMPLES

Although a more specific explanation of this invention will be presented in the following, the present invention is not in any way restricted to that described in the examples. Further, in the following explanation, "part(s)" refers to "part(s) by weight", and "%" refers to "% by weight", unless explicitly shown otherwise.

<Component (A)>

The following six types were prepared for the experiments:

A1: A cresol novolak resin [m-cresol:p-cresol =6:4(molar ratio), Weight–average molecular weight Mw=11,000]

A2: A cresol-xylenol novolak resin [m-cresol:p-cresol:3,5 xylenol=6:3:4 (molar ratio), Weight–average molecular weight Mw=8,000]

A3: A phenol novolak resin [Weight–average molecular weight Mw=6,000]

A4: Poly(p-vinylphenol) [Made by Maruzen Petrochemical Co. Ltd., Weight–average molecular weight Mw=3,000]

A5: Poly(brominated p-vinylphenol) [Made by Maruzen Petrochemical Co. Ltd., "Maruka Lyncur M", Weight–average molecular weight Mw=4,000]

A6: Poly(m-vinylphenol) [Weight–average molecular weight Mw =3,000]

<Component (B)>

The following two types were prepared:

B1: Hexamethoxymethyl melamine

B2: Tetramethoxymethyl glycoluryl

<Component (C)>

Three types of particulate rubbery material, C1 through C3, were prepared in accordance with the following procedures.

Particulate rubbery material C1

A monomer composition comprising butadiene, methyl methacrylate, methacrylic acid, and divinylbenzene in a weight ratio of 70:25:4:1, respectively, was processed by emulsion polymerization to yield a particulate rubbery material M1 comprising a cross-linked polymer with an average particle size of 0.058 $\mu$m and containing a carboxyl group. Ten parts of the particulate rubbery material was then mixed with 100 parts of an epoxy resin "Epicoat 828" (manufactured by Yuka-Shell Epoxy K.K.) together with triphenylphosphine as a modification reaction catalyst added in the ratio of 1% of the particulate rubbery material, heated and stirred at 90° C. for approximately 2 hours to obtain an epoxy-modified particulate rubbery material C1.

Additionally, when the particulate rubbery material C1 was dissolved in tetrahydrofuran and the residual carboxyl group (carboxylic acid) was analyzed by acid-base titration with phenolphthalein as the indicator, no carboxylic acid was detected, indicating that the carboxyl groups on the surface of the particulate rubbery material C1 had been completely converted to epoxy groups.

Particulate rubbery material C2

A monomer composition comprising butadiene, acrylonitrile, methacrylic acid, and divinylbenzene in a weight ratio of 67:30:2:1, respectively, was processed by emulsion polymerization to yield a particulate rubbery material made up of a cross-linked polymer with an average particle size of 0.070 μm and containing a carboxyl group. Fifteen parts of the particulate rubbery material was then mixed with 100 parts of an epoxy resin "EP-4100E" (manufactured by Asahi Denka Kogyo Co. Ltd.), together with triphenylphosphine as the modification reaction catalyst added in a ratio of 1% of the particulate rubbery material, heated and stirred for approximately 2 hours at 90° C. to obtain an epoxy-modified particulate rubbery material C2.

Particulate rubbery material C3

A monomer composition comprising butadiene, acrylonitrile, methacrylic acid, and divinylbenzene in a weight ratio of 77:19:3:1, respectively, was processed for emulsion polymerization to yield a particulate rubbery material made up of a cross-linked polymer with an average particle size of 0.062 μm and containing a carboxyl group. Fifteen parts of the particulate rubbery material was then mixed with 100 parts of an epoxy resin "EP-4100E" (manufactured by Asahi Denka Kogyo Co. Ltd.), together with triphenylphosphine as the modification reaction catalyst added in a ratio of 1% of the particulate rubbery material, heated and stirred for approximately 2 hours at 90° C. to obtain an epoxy-modified particulate rubbery material C2.

<Component (D)>

The following three types of liquid rubbery material were prepared:

D1: Butadiene-acrylonitrile-methacrylic acid copolymer [butadiene:acrylonitrile:methacrylic acid=60:35:5 (molar ratio), Number average molecular weight Mn=6,000, Glass transition temperature Tg=−39° C.]

D2: Butadiene-acrylonitrile-hydroxyethyl acrylate copolymer [butadiene:acrylonitrile:hydroxyethyl acrylate= 55:30:15 (molar ratio), Number average molecular weight Mn=8,000, Glass transition temperature Tg=−25° C.]

D3: Butadiene-acrylonitrile-hydroxyethyl acrylate-methacrylic acid copolymer [butadiene:acrylonitrile:hydroxyethyl acrylate-:methacrylic acid=60:25:10:5 (molar ratio), Number average molecular weight Mn=4,500, Glass transition temperature Tg=−30° C.]

<component (E)>

The following three types of photochemical polymerization initiator were prepared:

E1: 2,4-trichloromethyl (4'-methoxyphenyl)-6-triazine

E2: 2,4-trichloromethyl (4'-methoxystyryl)-6-triazine

E3: Diphenyl iodonium-9,10-dimethoxy anthracene sulfonate

<Additive F>

The following two types of epoxy resin were prepared. These were used in place of the component (C) in the composition according to the present invention, for comparison purposes:

F1: Phenol novolak epoxy resin

F2: Bisphenol type epoxy resin

<Solvent>

The following four types of organic solvent were prepared:

MMP: 3-methoxy methylpropionate

DAA: Diacetylacetone

PGMEA: Propylene glycol monomethyl ether acetate

EEP: 3-ethoxy ethylpropionate

Examples 1–14, Comparative Examples 1–7

<Preparation of compositions>

The above mentioned Components A, B, C, D, and E as well as an additive and solvent as necessary were compounded according to the formulations given in Tables 1 and 2. Each of the resultant mixtures was mixed and stirred with a Henshell mixer to prepare photo sensitive resin compositions.

TABLE 1

| | Component (A) Alkali-soluble resin | | | | Component (B) Amino resin | | Component (C) Particulate rubbery material | | Component (D) Liquid rubbery material | | Component (E) Photo polymerization initiator | | Solvent | |
|---|---|---|---|---|---|---|---|---|---|---|---|---|---|---|
| Examples | Type | Quantity | Type | Quantity | Type | Quantity | Type | Quantity | Type | Quantity | Type | Quantity | Type | Quantity |
| 1 | A1 | 300 | A4 | 70 | B1 | 20 | C1 | 23 | D1 | 35 | E1 | 1 | MMP | 90 |
| 2 | A1 | 50 | A4 | 50 | B1 | 30 | C1 | 18 | D1 | 15 | E1 | 1 | MMP | 90 |
| 3 | A1 | 65 | A4 | 35 | B1 | 35 | C1 | 20 | D2 | 20 | E1 | 0.8 | MMP | 90 |
| 4 | A1 | 80 | A4 | 20 | B1 | 45 | C1 | 20 | D2 | 15 | E1 | 0.8 | MMP | 90 |
| 5 | A2 | 50 | A4 | 50 | B1 | 35 | C2 | 18 | D3 | 20 | E1 | 1 | MMP | 90 |
| 6 | A3 | 75 | A5 | 25 | B1 | 30 | C2 | 18 | D3 | 20 | E1 | 1 | MMP | 90 |
| 7 | A1 | 75 | A5 | 25 | B1 | 30 | C2 | 18 | D1 | 20 | E1 | 0.5 | EEP | 90 |
| 8 | A1 | 50 | A6 | 50 | B1 | 45 | C2 | 18 | D1 | 10 | E1 | 0.8 | EEP | 90 |
| 9 | A2 | 50 | A6 | 50 | B2 | 35 | C3 | 15 | D2 | 20 | E2 | 1 | DAA | 90 |
| 10 | A1 | 70 | A4 | 30 | B2 | 25 | C3 | 18 | D2 | 25 | E2 | 1 | DAA | 90 |
| 11 | A1 | 50 | A4 | 50 | B1 | 35 | C3 | 18 | D3 | 25 | E3 | 1 | PGMEA | 90 |
| 12 | A1 | 50 | A4 | 50 | B1 | 35 | C3 | 18 | D3 | 25 | E3 | 1 | PGMEA | 90 |
| 13 | A1 | 100 | — | — | B1 | 35 | C1 | 18 | D1 | 25 | E1 | 0.8 | MMP | 90 |
| 14 | A6 | 100 | — | — | B1 | 35 | C1 | 18 | D1 | 25 | E1 | 1 | MMP | 90 |

(Unit of quantity: Part)

TABLE 2

| Comparative Examples | Component (A) Alkali-soluble resin | | Component (B) Amino resin | | Component (C) Particulate rubbery material | | Component (D) Liquid rubbery material | | Component (E) Photo polymerization initiator | | Component F Additive | | Solvent | |
|---|---|---|---|---|---|---|---|---|---|---|---|---|---|---|
| | Type | Quantity | Type | Quantity | Type | Quantity | Type | Quantity | Type | Quantity | Type | Quantity | Type | Quantity |
| 1 | A1 | 30 | A4 | 70 | B1 | 20 | — | — | — | — | E1 | 1 | — | — | MMP | 90 |
| 2 | A1 | 50 | A4 | 50 | B1 | 30 | — | — | D1 | 15 | E1 | 1 | — | — | MMP | 90 |
| 3 | A1 | 50 | A4 | 50 | B1 | 30 | — | — | D1 | 50 | E1 | 1 | — | — | MMP | 90 |
| 4 | A1 | 65 | A4 | 35 | B1 | 35 | C1 | 20 | — | — | E1 | 1 | — | — | MMP | 90 |
| 5 | A1 | 65 | A4 | 35 | B1 | 35 | C1 | 40 | — | — | E1 | 1 | — | — | MMP | 90 |
| 6 | A1 | 75 | A5 | 25 | B1 | 30 | — | — | D1 | 20 | E1 | 1 | F1 | 25 | MMP | 90 |
| 7 | A1 | 50 | A6 | 50 | B1 | 45 | — | — | D1 | 10 | E1 | 0.5 | F1 | 30 | MMP | 90 |

(Unit of quantity: Part)

<Performance evaluation of compositions and preparation of multi-layered circuit boards>

(1) Preparation of photosensitivity evaluation test substrate and evaluation:

Using a strip of glass-epoxy resin with one side covered with metallic copper as the test piece, the said side was coated with each of the compositions prepared in accordance with the Examples 1 through 14, and the Comparative Examples 1 through 7 using a spin coater, and dried in a hot air dryer at 90° C. for 10 minutes to form a thin film of a thickness after drying of approximately 50 μm.

For each of the test pieces obtained in the above, the thin film was exposed through testing film masks having perforation patterns of 25, 50, 75, 100, 150, and 200 μM in diameter, respectively. The exposure was provided using an exposure system (ORC Manufacturing Co., Ltd., Model "HMW-321B") under contact exposure conditions and at an exposure intensity of 1,000 mJ/cm$^2$.

The test pieces after exposure were heated to 120° C. for 5 minutes, and developed under a shower of 1.0% aqueous solution of sodium hydroxide, at a pressure of 2 kg/cm$^2$ for 180 to 600 seconds, to obtain insulating layers having piercing holes, i.e. photo-via-holes, reaching the metallic copper layer. The test pieces with the insulating layer were then rinsed and dried.

Each of the test pieces thus obtained was evaluated for the resolution property. For the resolution test, photolithography was conducted so that photo-via-holes in varying diameters would be created on the insulating layer, and the diameter of the smallest photo-via-holes (called the "minimum piercing hole diameter") that were confirmed as exposing the metallic copper layer was determined. This means that the smaller the minimum piercing hole diameter, the higher the resolution of the layer in question. The results are given in Tables 3 and 4.

Next, each test piece with an insulating layer was cured by heating in a hot air oven at 150° C. for 60 minutes, then processed with a surface roughening treatment on the insulating layer by immersing the test piece in an aqueous solution of potassium permanganate—sodium hydroxide (with 3% and 2% concentrations, respectively) for 10 minutes with the temperature maintained at 65° C. The test piece was subsequently immersed in a 5% aqueous solution of oxalic acid at room temperature for 5 minutes to neutralize, then thoroughly rinsed with water.

The surface of each test piece was inspected and evaluated with a scanning electron microscope for the roughness. Results are listed in Tables 3 and 4. In the evaluation, a surface condition that shows an adequate roughening effect with minute concave/convex profiles observed is given a "Good" rating, and all others, a "Failure".

Next, the surfaces of the insulating layer treated with the roughening process and the inner walls of the piercing holes were treated to carry the plating catalyst by immersing each test piece in a palladium chloride-type catalyst liquid for 6 minutes at room temperature, followed by immersion in a catalyst activation liquid for 8 minutes at room temperature to activate the plating catalyst. Following rinsing with water, the test pieces were then plated with electroless copper for 20 minutes at room temperature. For the catalyst liquid, catalyst activation liquid, and electroless copper plating liquid in the above process, "OPC Process M Series" chemicals made by Okuno Pharmaceutical Co., Ltd. were used. Subsequently, electrolytic copper plating was provided using an electrolytic copper plating liquid comprising an aqueous solution of copper sulfate and sulfuric acid (concentrations; copper sulfate: 210 g/L, sulfuric acid: 52 g/L, pH=1.0), with an electric current density of 3.0 mA/dm, so that a metallic copper layer of 20 μm combined thickness was formed over the entire surface of the insulating layer, followed by heat treatment of the test pieces at 150° C. for one hour.

The above test pieces were then notched at 1 cm intervals along their top surfaces, and tested for the peeling strength of the metallic copper layer (JIS C 6481) by peeling the layer from the test piece edges with a peeling tester. The results are given in Tables-3 and -4. For the peeling strength data, the most frequent value obtained in the peeling attempts for 10 cm has been adopted.

(2) Measurement of glass transition temperature:

The surface of a polyethylene terephthalate film was coated with a release agent, and thin films of test samples having a thickness of 50 μm were prepared in procedures similar to (1) described above. The entire film areas were then exposed to light at an exposure intensity of 1,000 mJ/cm$^2$, and heat-cured at 150° C. for 2 hours to obtain the test films which then were peeled off the polyethylene terephthalate film.

The above test films were inspected for changes in modulus of elasticity with an elastometer, "Rheovibron RHEO-1021" (Orientec Co., Ltd.), and the glass transition temperatures were obtained, determined as the tan δ peak-top. The results are given in Tables 3 and 4.

TABLE 3

| Examples | Glass transition temperature (° C.) | Development time (sec) | Resolution (μm) | Developing properties | Surface roughness | Peeling strength (g/cm) |
|---|---|---|---|---|---|---|
| 1 | 195 | 180 | 50 | ○ | Good | 1200 |
| 2 | 188 | 240 | 50 | ○ | Good | 1000 |
| 3 | 181 | 240 | 50 | ○ | Good | 1200 |
| 4 | 171 | 280 | 70 | ○ | Good | 1500 |
| 5 | 183 | 240 | 50 | ○ | Good | 1300 |
| 6 | 173 | 240 | 60 | ○ | Good | 1100 |
| 7 | 177 | 240 | 60 | ○ | Good | 1100 |
| 8 | 180 | 240 | 50 | ○ | Good | 1000 |
| 9 | 185 | 240 | 50 | ○ | Good | 1400 |
| 10 | 185 | 240 | 70 | ○ | Good | 1400 |
| 11 | 188 | 240 | 50 | ○ | Good | 1600 |
| 12 | 189 | 240 | 50 | ○ | Good | 1500 |
| 13 | 192 | 240 | 50 | ○ | Good | 1200 |
| 14 | 180 | 240 | 50 | ○ | Good | 1100 |

TABLE 4

| Examples | Glass transition temperature (° C.) | Development time (sec) | Resolution (μm) | Developing properties | Surface roughness | Peeling strength (g/cm) |
|---|---|---|---|---|---|---|
| 1 | 198 | 90 | 50 | ○ | Bad | Below 200 |
| 2 | 190 | 105 | 50 | ○ | Bad | Below 200 |
| 3 | 162 | 120 | — | x | Bad | Below 200 |
| 4 | 191 | 120 | 50 | ○ | Bad | Below 200 |
| 5 | 182 | 210 | 150 | x | Bad | Below 200 |
| 6 | 165 | 280 | 250 | x | Bad | 260 |
| 7 | 178 | 240 | 150 | ○ | Bad | 330 |

The radiation sensitive resin composition in the present invention, by containing an alkali-soluble resin and cross-linking agent together with particulate rubbery material and liquid rubbery material as the essential components, is capable of providing an insulating layer that has high resolution enabling high precision formation of photo-via-holes with small diameters, which layer can be developed with an alkaline solution, having high resistance to plating solutions as well as excellent adhesion with the conductive wiring. Therefore, the use of said composition will allow efficient manufacturing of multi-layered circuit boards of high reliability.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation sensitive resin composition comprising an alkali-soluble resin, a cross-linking agent, a particulate rubbery material, a liquid rubbery material, and a radiation polymerization initiator, wherein the particulate rubbery material is a cross-linked polymer chemically modified by an epoxy compound.

2. The radiation sensitive resin composition according to claim 1, wherein the alkali-soluble resin is a polyvinyl phenol or a phenol resin other than a polyvinyl phenol having a weight average molecular weight of 2,000 or higher, or both.

3. The radiation sensitive resin composition according to claim 2, wherein the phenol resin is a novolak resin.

4. The radiation sensitive resin composition according to claim 3, wherein the novolak resin is selected from the group consisting of cresol novolak resins, cresol-xylenol novolak resins, and phenol novolak resins.

5. The radiation sensitive resin composition according to claim 2, wherein the polyvinyl phenol is selected from the group consisting of poly(p-vinylphenol), poly(brominated p-vinylphenol), and poly(m-vinylphenol).

6. The radiation sensitive resin composition according to claim 1, wherein the cross-linking agent is an amino resin having two or more active methylol groups in the molecule.

7. The radiation sensitive resin composition according to claim 6, wherein the cross-linking agent is hexamethoxymethyl melamine or tetrabutoxymethyl glycoluryl.

8. The radiation sensitive resin composition according to claim 1, wherein the particulate rubbery material has an average particle size between 0.01 to 20 μm in diameter.

9. The radiation sensitive resin composition according to claim 1, wherein the liquid rubbery material has a number average molecular weight between 1,000 and 10,000 and a glass transition temperature of −20° C. or lower.

10. The radiation sensitive resin composition according to claim 9, wherein the liquid rubbery material is selected from the group consisting of butadiene-acrylonitrile-methacrylic acid copolymers, butadiene-acrylonitrile-hydroxyethyl (meth)acrylic acid copolymers, butadiene-acrylonitrile-hydroxyethyl methacrylate-methacrylic acid copolymers, isoprene-acrylonitrile-hydroxyethyl (meth)acrylic acid copolymers, and isoprene-acrylonitrile-methacrylic acid copolymers.

11. The radiation sensitive resin composition according to claim 1, wherein the radiation polymerization initiator is a photoacid generator.

12. The radiation sensitive resin composition according to claim 11, wherein the photoacid generator is selected from the group consisting of onium salt photoacid generators, triazine acid acid generators, and sulfonic ester acid generators.

13. The radiation sensitive resin composition according to claim 1, wherein the content of the alkali-soluble resin is 30 to 75% by weight.

14. The radiation sensitive resin composition according to claim 1, comprising 30 to 75% by weight of the an alkali-soluble resin, 5 to 30% by weight of the cross-linking agent, 5 to 25% by weight of the particulate rubbery material, 1 to 25% by weight of the liquid rubbery material, and 0.1 to 5% by weight of the radiation polymerization initiator.

15. In a method for fabricating a multi-layered circuit board comprising repetition of a step of preparing an insulating layer on top of a circuit board with conductive wiring thereon and a step of producing an additional conductive circuitry on the insulating layer so that the circuit is connected to the first circuit board, a method characterized in using the radiation sensitive resin composition of claim 1 for preparing the insulating layer.

16. The method according to claim 15, wherein the radiation sensitive resin composition is applied onto the top of the circuit board by a screen printing method, roll coating method, bar coating method, dip coating method, curtain flow coating method, spin coating method, or slit die coating method.

17. A cured product produced from the radiation sensitive resin composition of claim 1.

18. A multi-layered circuit board fabricated according to the method of claim 15.

* * * * *